(12) United States Patent
Watts et al.

(10) Patent No.: US 7,252,715 B2
(45) Date of Patent: Aug. 7, 2007

(54) SYSTEM FOR DISPENSING LIQUIDS

(75) Inventors: Michael P. C. Watts, Austin, TX (US); Byung-Jin Choi, Round Rock, TX (US); Sidlgata V. Sreenivasan, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 355 days.

(21) Appl. No.: 10/868,683

(22) Filed: Jun. 15, 2004

(65) Prior Publication Data

US 2004/0241324 A1 Dec. 2, 2004

Related U.S. Application Data

(62) Division of application No. 10/191,749, filed on Jul. 9, 2002, now Pat. No. 6,926,929.

(51) Int. Cl.
*B05C 11/10* (2006.01)
(52) U.S. Cl. ............... 118/688; 118/697; 118/707; 700/239; 700/240; 700/241
(58) Field of Classification Search ............. 118/688, 118/691, 695, 696, 697, 707; 700/239, 240, 700/241
See application file for complete search history.

(56) References Cited

U.S. PATENT DOCUMENTS 4,512,848 A 4/1985 Deckman et al.
4,614,300 A 9/1986 Falcoff
4,731,155 A 3/1988 Napoli et al.
4,999,280 A 3/1991 Hiraoka
5,028,366 A 7/1991 Harakal et al.
5,425,848 A 6/1995 Haisma et al.
5,601,641 A 2/1997 Stephens
5,669,303 A 9/1997 Maracas et al.
5,723,176 A 3/1998 Keyworth et al.
5,772,905 A 6/1998 Chou
5,849,209 A 12/1998 Kindt-Larsen et al.
5,849,222 A 12/1998 Jen et al.
5,938,080 A * 8/1999 Haaser et al. ............... 222/144
5,988,859 A * 11/1999 Kirk .......................... 700/232
6,309,580 B1 10/2001 Chou
6,334,960 B1 1/2002 Willson et al.
6,361,831 B1 3/2002 Sato et al.

(Continued)

FOREIGN PATENT DOCUMENTS

JP 02-24848 1/1990

(Continued)

OTHER PUBLICATIONS

Johnson et al., "Advances in Step and Flash Imprint Lithography," SPIE Microlithography Conference, Feb. 23, 2003.

(Continued)

*Primary Examiner*—George Koch
(74) *Attorney, Agent, or Firm*—Kolly K. Kordzik; Fish & Richardson P.C.

(57) ABSTRACT

The present invention provides a system to dispense a liquid, contained in a cartridge, onto a substrate employing a dispensing system under control of a processor in data communication with a memory.

24 Claims, 5 Drawing Sheets

U.S. PATENT DOCUMENTS

| | | | |
|---|---|---|---|
| 6,377,868 | B1 | 4/2002 | Gardner, Jr. |
| 6,391,217 | B2 | 5/2002 | Schaffer et al. |
| 6,482,742 | B1 | 11/2002 | Chou |
| 6,517,995 | B1 | 2/2003 | Jacobenson et al. |
| 6,518,189 | B1 | 2/2003 | Chou |
| 6,580,172 | B2 | 6/2003 | Mancini et al. |
| 6,646,662 | B1 | 11/2003 | Nebashi et al. |
| 6,696,220 | B2 | 2/2004 | Bailey et al. |
| 6,713,238 | B1 | 3/2004 | Chou et al. |
| 6,776,094 | B1 | 8/2004 | Whitesides et al. |
| 6,809,356 | B2 | 10/2004 | Chou |
| 6,828,244 | B2 | 12/2004 | Chou |
| 6,900,881 | B2 | 5/2005 | Sreenivasan et al. |
| 6,908,861 | B2 | 6/2005 | Sreenivasan et al. |
| 2002/0042027 | A1 | 4/2002 | Chou et al. |
| 2002/0132482 | A1 | 9/2002 | Chou |
| 2002/0167117 | A1 | 11/2002 | Chou |
| 2002/0177319 | A1 | 11/2002 | Chou |
| 2003/0034329 | A1 | 2/2003 | Chou |
| 2003/0080471 | A1 | 5/2003 | Chou |
| 2003/0080472 | A1 | 5/2003 | Chou |
| 2004/0007799 | A1 | 1/2004 | Choi et al. |
| 2004/0010341 | A1 | 1/2004 | Watts et al. |
| 2004/0021254 | A1 | 2/2004 | Sreenivasan et al. |
| 2004/0021866 | A1 | 2/2004 | Watts et al. |
| 2004/0022888 | A1 | 2/2004 | Sreenivasan et al. |
| 2004/0036201 | A1 | 2/2004 | Chou et al. |
| 2004/0046288 | A1 | 3/2004 | Chou |
| 2004/0110856 | A1 | 6/2004 | Young et al. |
| 2004/0118809 | A1 | 6/2004 | Chou et al. |
| 2004/0124566 | A1 | 7/2004 | Sreenivasan et al. |
| 2004/0131718 | A1 | 7/2004 | Chou et al. |
| 2004/0137734 | A1 | 7/2004 | Chou et al. |
| 2004/0156108 | A1 | 8/2004 | Chou et al. |
| 2004/0192041 | A1 | 9/2004 | Jeong et al. |
| 2004/0197843 | A1 | 10/2004 | Chou et al. |
| 2004/0250945 | A1 | 12/2004 | Zheng et al. |
| 2005/0037143 | A1 | 2/2005 | Chou et al. |

FOREIGN PATENT DOCUMENTS

| | | |
|---|---|---|
| JP | 02-92603 | 4/1990 |
| WO | WO 98/24070 | 6/1998 |
| WO | WO 99/05724 | 2/1999 |
| WO | WO 00/21689 | 4/2000 |
| WO | WO 01/47003 | 6/2001 |
| WO | WO 02/07199 | 1/2002 |
| WO | WO 03/010289 | 2/2003 |
| WO | WO 03/079416 | 9/2003 |
| WO | WO 03/099536 | 12/2003 |
| WO | WO 2004/013693 | 2/2004 |
| WO | WO 2004/016406 | 2/2004 |
| WO | WO 2004/114016 | 12/2004 |

OTHER PUBLICATIONS

Chou et al., "Lithographically Induced Self-assembly of Periodic Polymer Micropillar Arrays," J. Vac. Sci. Technol. B 17 (6), pp. 3197-3202, Nov. 1, 1999.

Colburn et al., "Step and Flash Imprint Lithography: A New Approach to High-Resolution Patterning," Proc. Of SPIE, vol. 3676, Mar. 1, 1999.

Chou, "Nanoimprint Lithography and Lithographically Induced Self-Assembly," MRS Bulletin, pp. 512-517, Jul. 1, 2001.

Choi et al., "Design of Orientation Stages for Step and Flash Imprint Lithography," Precision Engineering, pp. 192-199, Jan. 1, 2001.

Chou et al., "Imprint Lithography with Sub-10 nm Feature Size and High Throughput," Microelectronic Engineering 35, pp. 237-240, Jan. 1, 1997.

Haisma et al., "Mold-assisted Nanolithography: A Process for Reliable Pattern Replication," J. Vac. Sci. Technol. B, pp. 4124-4128, Nov. 1, 1996.

Chou et al., "Imprint of Sub-25 nm Vias and Trenches in Polymers," Appl. Phys. Lett. 67 (21), Nov. 20, 1995.

Colburn et al., "Step and Flash Imprint Lithography for sub-100 nm Patterning," Proceedings of SPIE vol. 3997, pp. 453-457, Jan. 1, 2000.

Chou et al., "Imprint Lithography with 25-Nanometer Resolution," Science vol. 272, pp. 85-87, Apr. 5, 1996.

Heidari, "Nanoimprint Lithography at the 6 in. Wafer Scale," J. Vac. Sci. Technol. B 18(6), pp. 3557-3560, Nov. 1, 2000.

Translation of Japanese Patent 02-92603.

Translation of Japanese Patent 02-24848.

Chou et al., "Ultrafast and Direct Imprint of Nanostructures in Silicon," Nature, col. 417, (Jun. 2002), pp. 835-837, Jun. 1, 2002.

Chou et al., "Nanoimprint Lithography," Journal of Vacuum Science Technolgoy B 14(16), pp. 4129-4133, Nov. 1, 1996.

Colburn et al., "Development and Advantages of Step-and-Flash Lithography," Solid State Technology, Jul. 1, 2001.

Colburn et al., "Characterization and Modeling of Volumetric and Mechanical Properties for Step and Flash Imprint Lithography Photopolymers," Journal of Vacuum Science Technology. vol. b. 19(6), Nov. 1, 2001.

Bailey et al., "Step and Flash Imprint Lithography: Defect Analysis," Journal of Vacuum Science, B 19(6), pp. 2806-2810, Nov. 1, 2001.

Bailey et al., "Step and Flash Imprint Lithography: Template Surface Treatment and Defect Analysis," Journal of Vacuum Science, B 18(6), pp. 3572-3577, Nov. 1, 2000.

Schneider et al., "Stripes of Paritally Fluorinated Alkyl Chains: Dipolar Langmuir Monolayers."

U.S. Appl. No. 11/101,139, naming Inventors Shackleton et al., entitled System for Controlling a Volume of Material on a Mold, filed Apr. 7, 2005.

U.S. Appl. No. 11/101,140, naming Inventors McMackin, entitled Method for Fast Flliing of Templates for Imprint Lithography Using on Template Dispense, filed Apr. 7, 2005.

NERAC.com Retro Search, Fluid Dispensing, May 4, 2005.

U.S. Appl. No. 11/126,946, naming Inventors Choi et al., entitled Formation of Discontinuous Films During an Imprint Lithography Process, filed May 11, 2005.

U.S. Appl. No. 11/127,041, naming Inventors Sreenivasan et al., entitled Step and Repeat Imprint Lithography Processes, filed May 11, 2005.

U.S. Appl. No. 11/127,041, naming Inventors Sreenivasan et al., entitled Step and Repeat Imprint Lithography Systems, filed May 11, 2005.

Translation of Japanese Patent 02-92603, Apr. 13, 1990.

Translation of Japanese Patent 02-24848, Jan. 26, 1990.

Schneider et al., "Stripes of Paritally Fluorinated Alkyl Chains: Dipolar Langmuir Monolayers.", unknown date.

* cited by examiner

SYSTEM FOR DISPENSING LIQUIDS

CLAIM TO PRIORITY

This application is a divisional patent application of U.S. patent application Ser. No. 10/191,749, filed Jul. 9, 2002, now U.S. Pat. No. 6,926,929, and entitled "System and Method for Dispensing Liquids", having Michael P. C. Watts, Byung-Jin Choi, and Sidlgata V. Sreenivasan listed as inventors, which is incorporated herein by reference.

BACKGROUND OF THE INVENTION

The field of invention relates generally to micro-fabrication of structures. More particularly, the present invention is directed to a system for dispensing liquids to facilitate patterning substrates using imprint lithography.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing increased reduction of the minimum feature dimension of the structures formed. Other areas of development in which micro-fabrication has been employed include biotechnology, optical technology, mechanical systems and the like.

An exemplary micro-fabrication technique is shown in U.S. Pat. No. 6,334,960 to Willson et al. Willson et al. disclose a method of forming a relief image in a structure. The method includes providing a substrate having a transfer layer. The transfer layer is covered with a polymerizable liquid composition. A mold makes mechanical contact with the polymerizable liquid. The mold includes a relief structure, and the polymerizable liquid composition fills the relief structure. The polymerizable liquid composition is then subjected to conditions to solidify and polymerize the same, forming a solidified polymeric material on the transfer layer that contains a relief structure complimentary to that of the mold. The mold is then separated from the solid polymeric material such that a replica of the relief structure in the mold is formed in the solidified polymeric material. The transfer layer and the solidified polymeric material are subjected to an environment to selectively etch the transfer layer relative to the solidified polymeric material such that a relief image is formed in the transfer layer. The time required and the minimum feature dimension provided by this technique is dependent upon, inter alia, the composition of the polymerizable material.

It is desired, therefore, to provide an improved technique of dispensing liquids to facilitate micro-fabrication.

SUMMARY OF THE INVENTION

The present invention includes a system to dispense a liquid, contained in a cartridge, onto a substrate employing a dispensing system under control of a processor in data communication with a memory. The method includes associating an identification code with the cartridge, defining a verifiable identification code. The verifiable identification code includes data concerning characteristics of the liquid, defining verifiable characteristic data. A request is received from a user to activate the dispensing system and permit dispensing of the liquid. To that end, the request includes the verifiable identification code and data concerning the user, defining user data. The verifiable identification code and the user data is compared to a database containing historical information concerning the user. The historical information includes identification codes of cartridges previously associated with the user, defining historical identification codes. The historical identification codes include historical data describing characteristics of liquids contained in the cartridges previously associated with the user. A requested authorization code is generated in response to ascertaining that the historical data matches the verifiable characteristic data. The requested authorization code is transmitted to the user to facilitate activation of the dispensing system in furtherance of dispensing the liquid.

DETAILED DESCRIPTION OF THE PREFERRED EMBODIMENTS

Figure 1:
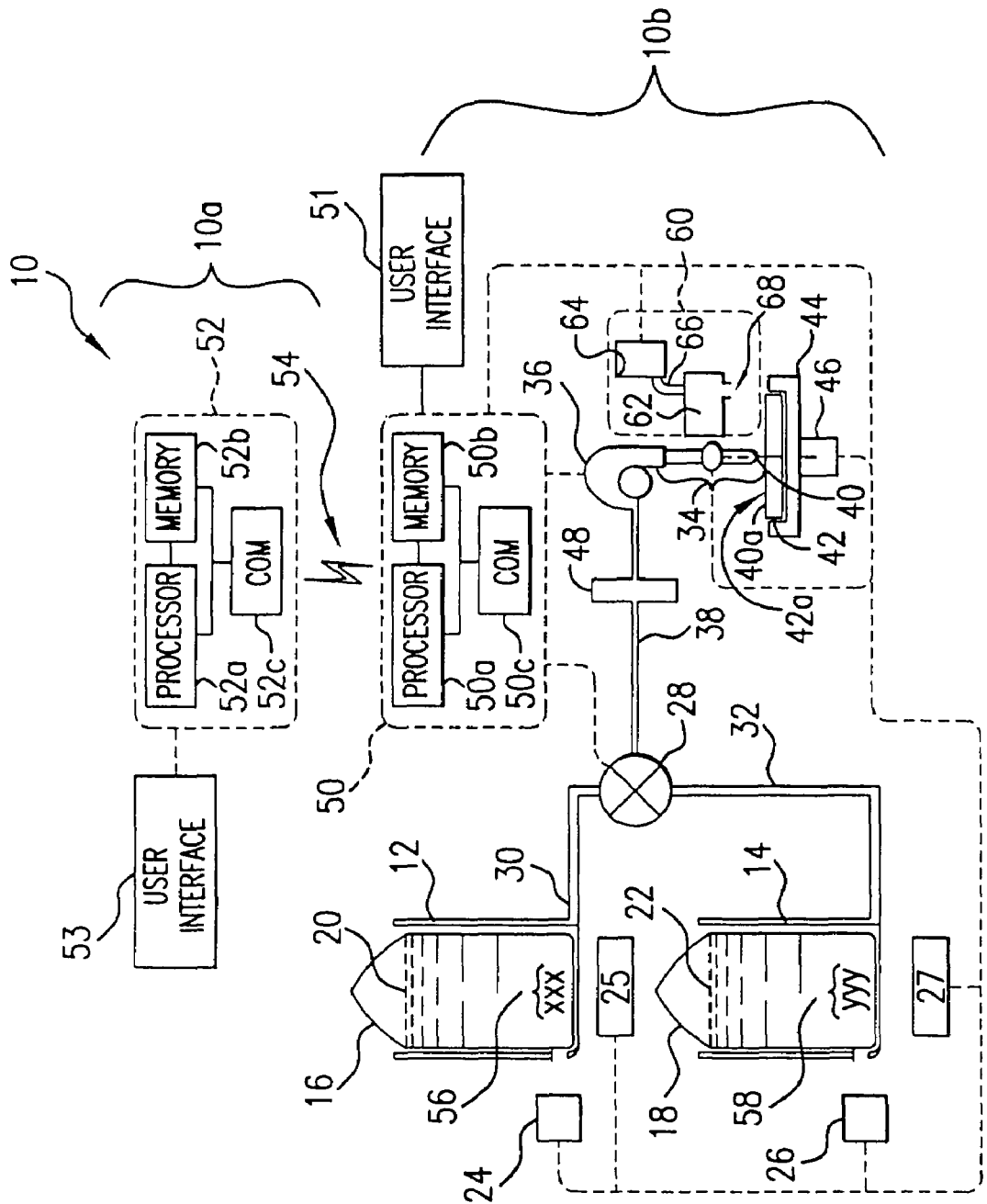
FIG. 1 is a simplified elevation view of a liquid dispensing system in accordance with one embodiment of the present invention.

Referring to FIG. 1, a dispensing system 10 in accordance with one embodiment of the present invention includes two sub-systems 10a and 10b. Sub-system 10b includes a plurality of receptacles 12 and 14, each of which is adapted to receive a cartridge 16 and 18, respectively. Each of cartridges 16 and 18 contains a liquid 20 and 22, respectively. A source of gas pressure (not shown) may be applied to cartridges 16 and 18. In optical communication with liquid 20 and 22 is a detector 24 and 26, respectively, to sense when liquid 20 and 22 has reached a predetermined level. A valve 28 is in fluid communication with cartridges 16 and 18 through conduits 30 and 32, respectively. A nozzle system 34 is in fluid communication with valve 28 via a pump 36 and a conduit 38. Valve 28 operates to selectively place cartridges 16 and 18 in fluid communication with pump 36. In this manner, pump 36 selectively creates a flow of liquid 20 or 22 to propagate through conduit 38 and into nozzle system 34. Liquid 20 or 22 propagating through nozzle system 34 egresses therefrom at tip 40. To that end, tip 40 of nozzle system 34 defines a dispensing axis 40a along which liquid 20 or 22 travels. Disposed opposite to tip 40 in said dispensing axis 40a is a substrate 42. Liquid 20 or 22 exiting tip 40 is deposited on substrate 42. The distance between tip 40 and substrate 42 is selected to avoid splashing of liquids, as well as to prevent gas from being present in liquid disposed thereon. An exemplary nozzle system 34 and pump 36 combination consist of a piezo-electric ink-jet system or a micro-solenoid system. These systems are suitable for use with system 10 because they can provide accurate and high-resolution volume control. It is desirable that system 10 dispense, onto substrate 42, liquid drops having a volume of 5 nano-liters or less. The surface energy at tip 40 may be designed for specific liquids to allow formation of drops of desired shapes for dispensing.

To allow any region of surface 42a of substrate 42 to receive liquid, substrate 42 rests atop of a mount 44. Mount 44 is connected to a set of motors 46 to move in two directions perpendicular to dispensing axis 40a and, optionally, along a third direction parallel to dispensing axis 40a. Optionally a filter 48 may be positioned in conduit 38 between valve 28 and pump 36 to remove unwanted gases and particles in a flow traveling therebetween. Filter 48 may be configured to be replaced automatically to facilitate continuous operation of system 10.

Operation of system 10 is controlled by the interaction of the two sub-systems 10a and 10b. To that end, sub-system 10b includes a processing system 50 and sub-system 10a includes a processing system 52. Processing systems 50 and 52 communicate over a communication link 54. Communication link 54 may be any known communication link such as a local area network communication with use of Ethernet protocols, or a public wide area network, such as a public switched telephone network over ASDL telephone lines or large bandwidth trunks, such as T1 or OC3 service. As a result, sub-system 10a may be remotely disposed with respect to sub-system 10b, i.e., processing system 10a may be disposed in an area that is different from the area in which sub-system 10b is disposed, e.g., a different room, a different building, a different country and the like.

Processing system 50 controls the operations of system 10 and processing system 52 provides authorization to processing system 50 to commence dispensing of liquid 20 or 22. To that end, processing system 50 is in data communication with detectors 24 and 26, valve 28, pump 36 and the set of motors 46 and includes a processor 50a, a memory 50b and a communications sub-system 50c both of which are in data communication with processor 50a. Also included in sub-system 10b is a user interface 51, which may consist of a keyboard, monitor, floppy disk drive system and other devices to interface a user with processor 50a. Processing system 50 operates to produce a plurality of discrete drops of liquid on surface 42a of substrate 42 by appropriately timing the movement of substrate 42 and egression of liquid 20 or 22 from tip 40.

Figure 2:
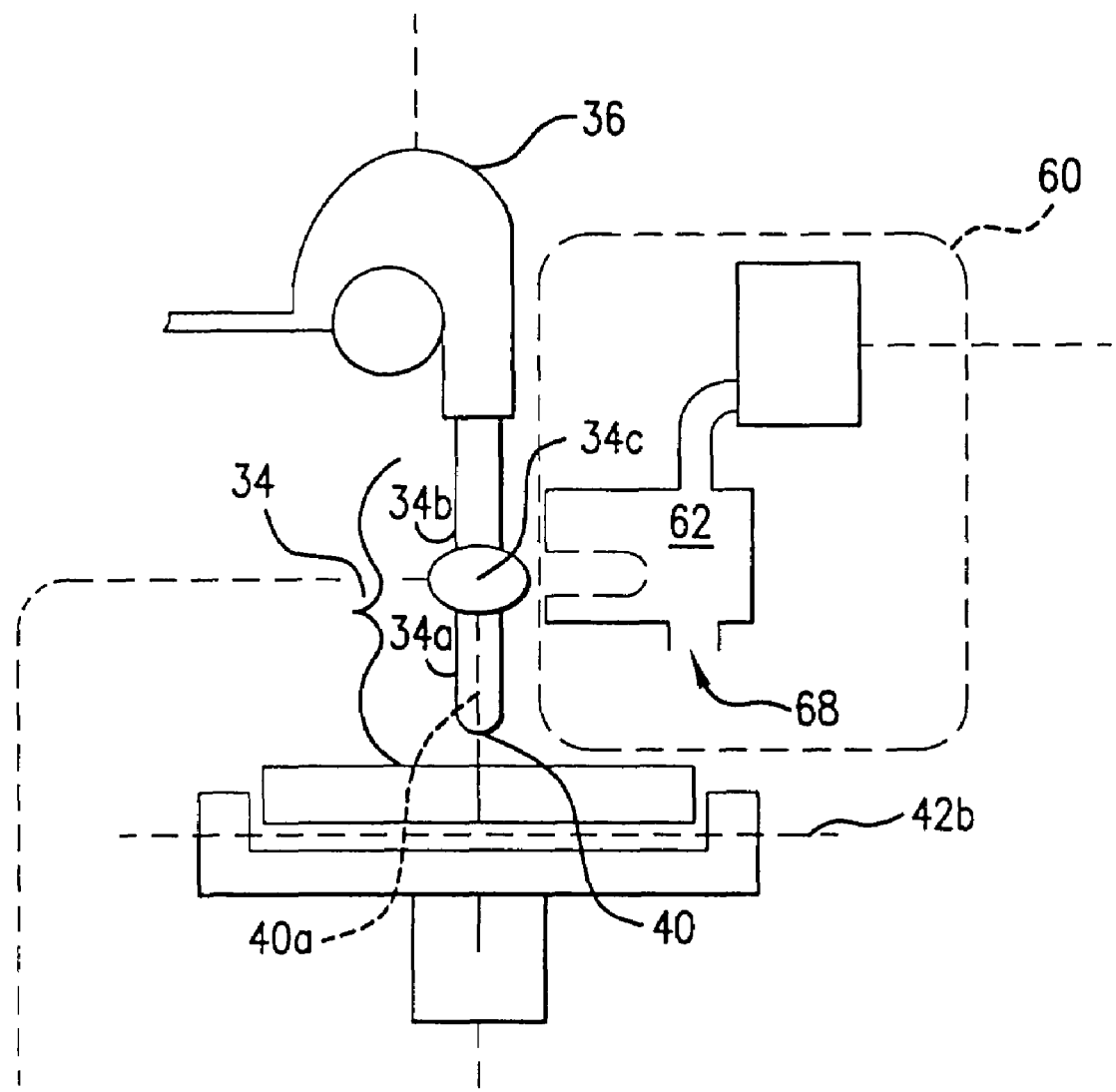
FIG. 2 is a detailed view of the nozzle system and cleaning station shown in FIG. 1, in accordance with one embodiment of the present invention.

Referring to FIGS. 1 and 2, it is desired that continuous delivery of liquid 20 and 22 to nozzle system 34 is effectuated. To that end, system 10 includes a cleaning station 60 having a chamber 62 and a supply of cleaning liquid 64. Supply 64 is in fluid communication with chamber 62 via conduit 66. Chamber 62 may include a waste drain 68 that may be connected to a vacuum source (not shown). Nozzle system 34 is designed to facilitate selectively placing tip 40 in chamber 62 for cleaning. To that end, nozzle system 34 includes a tip portion 34a and a base portion 34b. Base portion 34b is connected to pump 36. Tip portion 34a is pivotally coupled to base portion 34b through a pivot 34c to reciprocate between a dispensing position and a cleaning position. In the cleaning position (shown by dashed lines) dispensing axis 40a is orientated to extend parallel to a plane 42b in which substrate 42 lies. In the dispensing position, dispensing axis 40a extends transversely to plane 42b. In this manner tip 40 may be quickly cleaned during dispensing of liquid 20 or 22.

Alternatively, cleaning station 60 may be designed to move with respect to nozzle system 34, thereby abrogating the need for pivot 34c. In this manner, chamber 62 moves with respect to nozzle system 34 to ensure that tip 40 is disposed therein during cleaning. As such, system 10 may be configured so that mount 44 is moved so that the same is no longer proximate to tip 40 during cleaning. This has the further advantage of reducing particulate contamination of substrate 42. To that end, mount 44 and chamber 62 may be mounted to a moveable table (not shown) to reciprocate in and out of a proximity with tip 40 so that the tip 40 may be selectively placed in cleaning chamber 62. In furtherance of that end, cleaning of tip 40 may be performed during substrate 42 loading to further reduce particulate contamination.

To further facilitate continuous delivery of liquid 20 and 22 to nozzle system 34, system 10 includes two cartridges 16 and 18. Each of cartridges 16 and 18 which has a detector 24 and 26 in optical communication with liquid 20 and 22, contained therein. In this manner, once detector 24 senses that liquid 20 has reached a minimum level in cartridge 16, a signal is transmitted to processor 50a. In response, processor 50a activates valve 28 to disrupt fluid communication between conduits 30 and 32 and effectuate fluid communication between conduits 32 and 38. Thereafter, a user (not shown), such as the owner/lessee of sub-system 10b, would remove cartridge 16 from receptacle 12 and replace the same with a new cartridge. In this manner, pump 36 may maintain a continuous flow of liquid to nozzle system 34, while cartridge 16 is being replaced. A similar situation is present when cartridge 18 is replaced.

However, once detector 24 has sensed that liquid 20 has reached a minimum level, valve 28 cannot be activated to place conduits 30 and 32 in fluid communication until an authorization code has been received. Were both detectors 24 and 26 to sense that liquid level had reached a minimum level then processor 50a would deactivate pump 36, until authorization was received for at least one of the replaced cartridges 16 or 18. Alternatively, pump 36 would be activated by processor 50a only after an authorization code had been received for all of cartridges 16 and 18. This is to prevent, inter alia, cross-contamination of liquids in system 10, because such cross-contamination may produce catastrophic failures in the subsequent patterning of substrate 42.

To avoid cross-contamination, a verification sequence is invoked before dispensing to ensure that the liquid 20 or 22 may be identified and does not differ from liquid that has been previously dispensed by system 10. To that end, each cartridge 16 and 18 includes indicia 56 and 58, respectively, that recites an identification code. The identification code associated with each cartridge 16 and 18 is unique and differs from the identification code associated with the remaining cartridges. The identification code also includes information describing characteristics of liquid 20 or 22, such as the chemical description of the same. As mentioned above, an exemplary use for the present invention is dispensing liquids on substrate 42 in preparation for patterning substrate 42 employing imprint lithography techniques. As a result, exemplary liquids that may be dispensed by system 10 include liquids having one or more of the following ultra violet curable compositions:

Composition 1 n-butyl acrylate+(3-acryloxypropyltristrimethyl-siloxy)silane+1,3-bis(3-methacryloxypropyl)tetram-ethyldisiloxane Composition 2 t-n-butyl acrylate+(3-acryloxypropyltristrimethyl-siloxy)silane+Ethylene diol diacrylate Composition 3 t-butyl acrylate+methacryloxypropylpentameth-yldisiloxane+1,3-bis(3-methacryloxypropyl)tetram-ethyldisiloxane The above-identified compositions also include stabilizers that are well known in the chemical art to increase the operational life, as well as initiators. The initiators included in the aforementioned compositions are typically responsive to ultra-violet radiation to cause the compositions to solidify once exposed to ultra violet radiation. As a result, cartridges 16 and 18, as well as conduits 30, 32 and 38 through which liquid 20 and 22 propagate are opaque to ultra-violet radiation. Additionally, system 10 may be enclosed within a housing (not shown) to shield the same from ultra violet radiation.

Referring to FIG. 1, when seeking authorization to dispense liquid, a user operates on processing system 50 to generate a request to processing system 52 over communication link 54. The request includes the identification code recited in the indicia 56 or 58 and information concerning system 10, such as the name of the owner/lessee of system 10, as well as an identification number of system 10. To that end, indicia 56 and 58 may be visually perceivable with an unaided eye so that a user may enter the information contained therein into processing system 50 using user interface 51. Alternatively, indicia 56 and 58 may be machine readable, such as for example, a bar code reader. To that end, a reader 25 may be in data communication with indicia 56 and a reader 27 may be in data communication with indicia 58.

Processing system 52 then receives the request and determines whether authorization should be transmitted to processing system 50 to allow dispensing of liquid 20 or 22. To that end, processing system 52 includes a processor 52a, a memory 52b and a communication sub-system 52c both of which are in data communication with processor 52a. Also included in sub-system 10b is a user interface 53, which may consist of a keyboard, monitor, floppy disk drive system and other devices to interface a user with processor 52a. Memory 52b stores a database containing historical information concerning system 10. The historical information may include the name of the owner/lessee of sub-system 10b, a unique identifier of sub-system 10b, as well as information concerning previous cartridges ordered by the owner/lessee of sub-system 10b, such as the identification codes of the previously ordered cartridges, defining historical identification codes. The historical identification codes include historical data concerning characteristics of liquids contained in the previously ordered cartridges sent to the owner/lessee.

Upon receipt of the request, processor 52a operates on the request and memory 52b to compare the identification code and the system data with the historical information to determine whether to generate a requested authorization code in response. Typically, a requested authorization code is transmitted by processing system 52 to processing system 50 upon finding that the liquid 20 or 22 in cartridges 16 and 18, respectively, matches the liquid ordered by the owner/lessee of sub-system 10b and/or is not incompatible with liquids previously dispensed in sub-system 10b.

Figure 3:
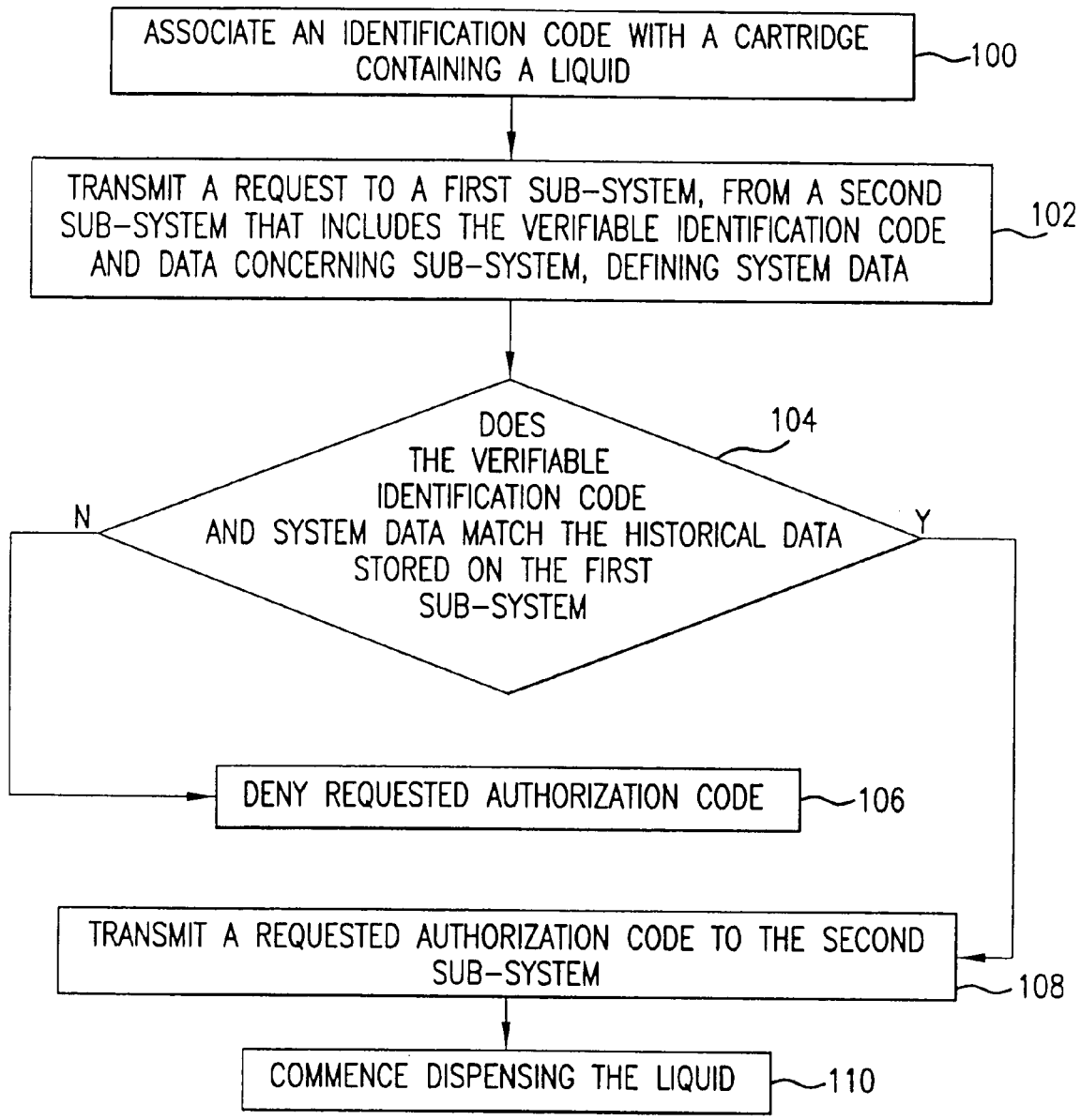
FIG. 3 is a flow diagram of a method for dispensing liquid in accordance with one embodiment of the present invention.

Referring to FIGS. 1 and 3, the operation of system 10 in accordance with one embodiment will be discussed with respect to cartridge 16, but applies equally well to cartridge 18. At step 100 identification code recited in indicia 56 is associated with cartridges, defining a verifiable identification code. The verifiable identification code includes data concerning characteristics of liquid 20, defining verifiable characteristic data. At step 102 a request is received by processing system 52. The request includes the verifiable identification code and data concerning sub-system 10b, defining system data. At step 104, it is determined whether the verifiable identification code and system data matches the historical data. This is achieved by comparing the verifiable identification code and the system data to the database stored in memory 52. The historical information includes a list of identification codes of cartridges sent to the owner/lessee of sub-system 10b. If the verifiable identification code does not match one of the historical identification codes, authorization is denied at step 106. Otherwise, a requested authorization code is transmitted to sub-system 10b at step 108. Were the requested authorization code transmitted to sub-system 10b, dispensing would commence at step 110.

Figure 4:
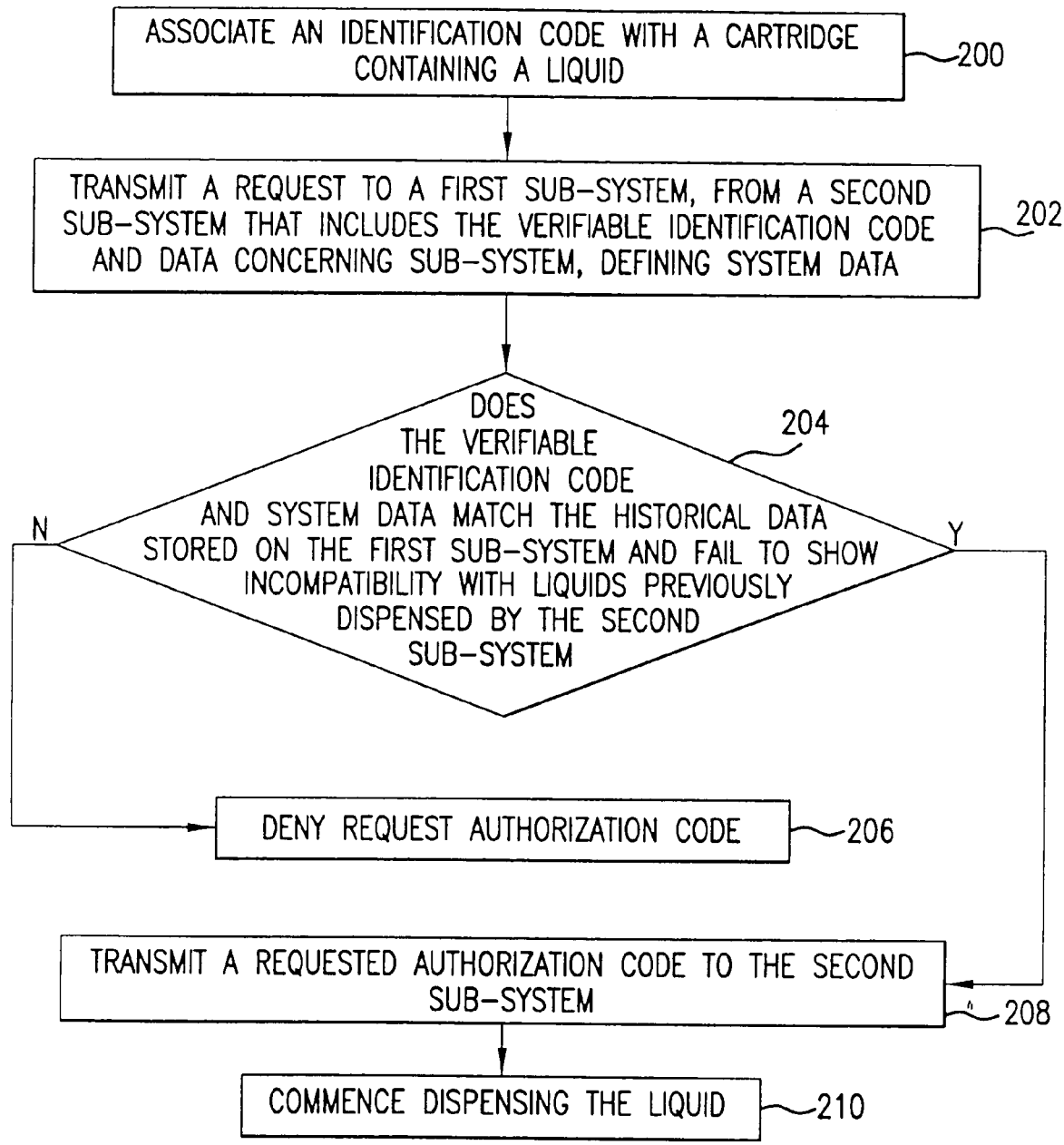
FIG. 4 is a flow diagram of a method for dispensing liquid in accordance with a second embodiment of the present invention.

Referring to FIGS. 1 and 4, operation of system 10 in accordance with an alternate embodiment includes steps 200, 202, 204, 206, 208 and 210. Steps 200, 202, 206, 208 and 210 are identical to steps 100, 102, 106, 108 and 110, mentioned above with respect to FIG. 3. Referring again to FIG. 4, however, at step 204, it is determined whether the verifiable identification code and system data matches the historical data and fails to show any incompatibility with liquids previously dispensed in sub-system 10b. This is achieved by comparing the verifiable identification code and the system data to the database stored in memory 52b. The historical information includes a list of identification codes of cartridges sent to the owner/lessee of sub-system 10b. If the verifiable identification code does not match one of the historical identification codes, or does not indicate compatibility with liquids previously sent to the owner/lessee of sub-system 10b, then a requested authorization code is denied at step 206. Otherwise, a requested authorization code is transmitted to sub-system 10b at step 208. Were the requested authorization code transmitted to sub-system 10b, dispensing would commence at step 210. Sub-system 10b could verify the authenticity of the authorization code transmitted by comparing the same to a copy of the authorization code that is embedded in the program stored in memory 50b.

With the present invention it is possible to verify that the liquid in cartridges 16 and 18 is liquid that is compatible with previous liquid dispensed by sub-system 10b, as well as to ensure that the liquid is from a valid source. To that end, verification of compatibility and validity may be effectuated from an external computer, discussed above with respect to sub-system 10a. Alternatively, verification may be effectuated from an internal computer, such as processing system 50. In this embodiment, a user may enter a security code in user interface 51. To ensure authenticity of cartridges 16 and 18, indicia 56 and 58 may be encoded with a security key.

Figure 5:
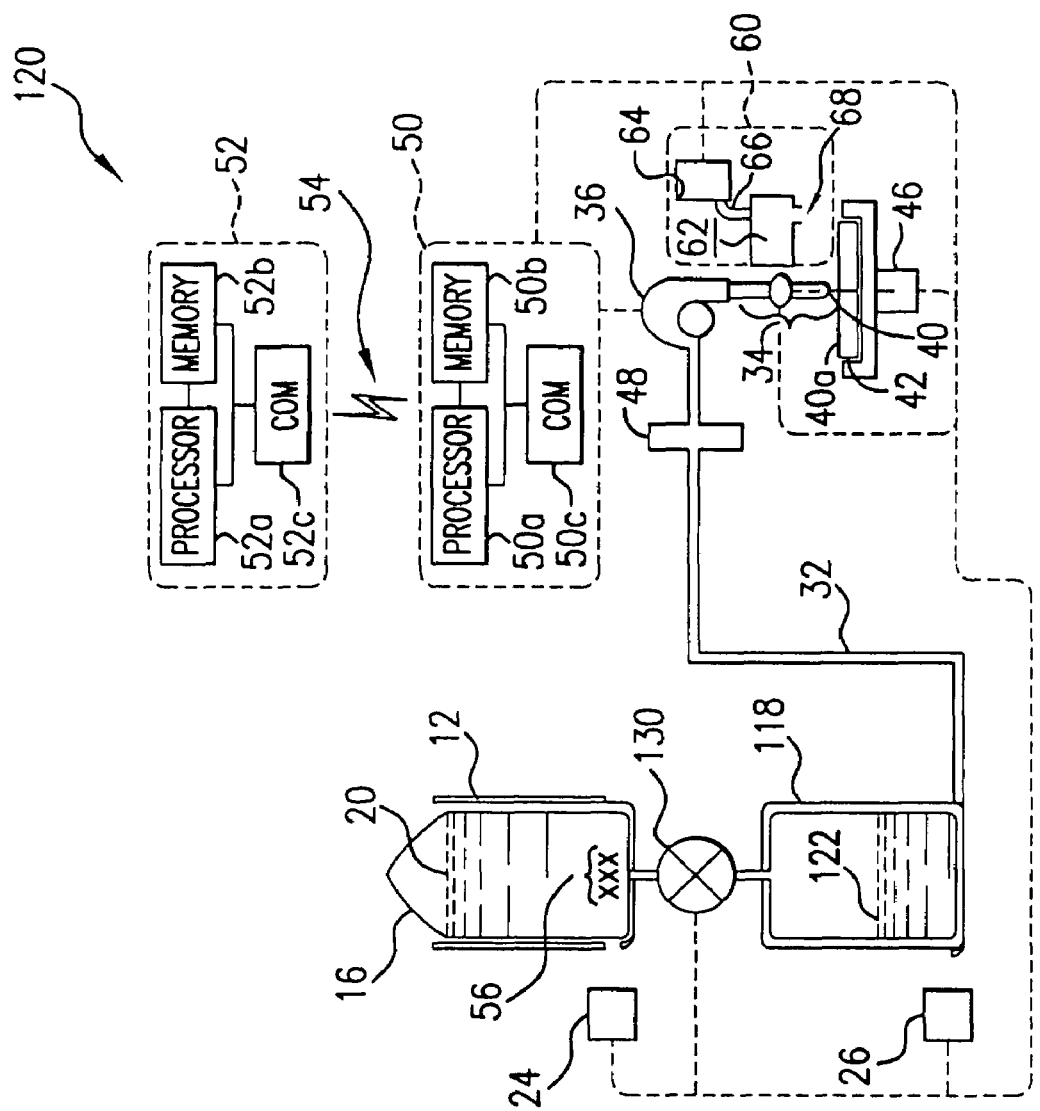
FIG. 5 is a simplified elevation view of a liquid dispensing system in accordance with a second embodiment of the present invention.

Referring to both FIGS. 1 and 5 in another embodiment system 120 omits a second cartridge, such as cartridge 18, as well as receptacle 14. Placed in lieu thereof is a liquid reservoir 118 containing liquid 122. Reservoir 118 may be selectively placed in fluid communication with liquid 20 contained in cartridge 16 with valve 130. Nozzle system 34 is in fluid communication with reservoir 118 via pump 36 and, optionally, filter 48. In this arrangement, detector 26 senses when liquid 122 has reached a minimum level in reservoir 118 and produces a signal in response thereto. Processor 50*a* senses the signal produced by detector 26 and activated valve 130 to fill reservoir with liquid 20, which typically has the same chemical composition as liquid 122. Once detector 24 senses that liquid 20 has reached minimum level in cartridge 16, a warning may be sent indicating that cartridge 16 must be replaced. Thereafter, a requested authorization code would have to be entered into processing system 50, as described above.

The embodiments of the present invention described above are exemplary. Many changes and modifications may be made to the disclosure recited above, while remaining within the scope of the invention. For example, were two or more incompatible liquids required, an additional sub-system 10*b* could be implemented. Moreover, for each additional liquid employed that was incompatible with existing liquids employed by an owner/lessee, an additional sub-system 10*b* would be present, all of which could communicate with a common sub-system 10*a*. The scope of the invention should, therefore, be determined not with reference to the above description, but instead should be determined with reference to the appended claims along with their full scope of equivalents.

What is claimed is:

1. A system for dispensing a liquid onto a substrate, said system comprising:
    a source of said liquid;
    a control system to selectively authorize dispensing of said liquid from said source upon verifying said liquid contains characteristics matching characteristics of liquids previously dispensed from said source, wherein said source further includes data concerning characteristics of said liquid, defining verifiable characteristics data, with said control system further including an authorization station to generate an authorization code in response to verifying that said verifiable characteristic data matches historical data stored by said authorization station, with said historical data including information concerning characteristics of liquids previously associated with said system.

2. The system as recited in claim 1 wherein said source further includes a primary cartridge containing said liquid, a dispensing nozzle system in fluid communication with said primary cartridge, and a pump to create a flow of said liquid from said primary cartridge to exit said nozzle system.

3. The system as recited in claim 2 wherein said dispensing nozzle has a surface treatment to allow formation of a drop having a desired shape.

4. The system as recited in claim 1 wherein said source further includes a primary cartridge containing said liquid, a dispensing nozzle system in fluid communication with said primary cartridge, and a pump to create a flow of said liquid from said primary cartridge to exit said nozzle system and said control system further includes a processor in data communication with said pump, a memory in data communication with said processor, with said memory including a program to be operated on by said processor to produce a request for an authorization code to enable said pump to create said flow, with said request including information concerning said system, defining system data.

5. The system as recited in claim 4 wherein said program further includes an embedded authorization code and a sub-routine to be operated on by said processor to compare said embedded authorization code with said requested authorization code and activate said pump in response to ascertaining that said embedded authorization code and said requested authorization code match.

6. The system as recited in claim 4 wherein said verifiable characteristic data includes a chemical description of said liquid and said cartridge is formed from a material that is opaque to ultra violet radiation.

7. A system for dispensing a liquid onto a substrate, said system comprising:
    a primary cartridge containing said liquid, said primary cartridge including an identification code that includes data concerning characteristics of said liquid, defining verifiable characteristic data;
    a dispensing system in fluid communication with said primary cartridge;
    a control system, in data communication with said dipensing system, to selectively authorize dispensing of said liquid upon verifying said liquid contains characteristics matching characteristics of liquids previously dispensed from said source, wherein said dispensing system includes a dispensing nozzle system in fluid communication with said primary cartridge and a pump to create a flow of said liquid from primary cartridge to exit said nozzle system, wherein said substrate lies in a plane, and said nozzle system that defines a dispensing axis along which said liquid propagates, with said nozzle system including means for selectively changing an orientation of said dispensing axis to move between a dispensing orientation and a cleaning orientation, with said dispensing axis extending transversely to said plane in said dispensing orientation and said dispensing axis extending parallel to said plane in said cleaning orientation.

8. The system as recited in claim 7 wherein said dispensing nozzle has a surface treatment to allow formation of a drop having a desired shape.

9. A system for dispensing a liquid onto a substrate, said system comprising:
    a primary cartridge containing said liquid, said primary cartridge including an identification code that includes data concerning characteristics of said liquid, defining verifiable characteristic data;
    a dispensing system in fluid communication with said primary cartridge;
    a control system, in data communication with said dipensing system, to selectively authorize dispensing of said liquid upon verifying said liquid contains characteristics matching characteristics of liquids previously dispensed from said source, wherein said dispensing system includes a dispensing nozzle system in fluid communication with said primary cartridge and a pump to create a flow of said liquid from primary cartridge to exit said nozzle system, further including a cleaning station having a chamber with a supply of cleaning liquid and an evacuation system both of which are in fluid communication therewith, with said nozzle system being disposed in said chamber when said dispensing axis is in said cleaning orientation.

10. A system for dispensing a liquid onto a substrate, said system comprising:
a primary cartridge containing said liquid, said primary cartridge including an identification code that includes data concerning characteristics of said liquid, defining verifiable characteristic data;
a dispensing system in fluid communication with said primary cartridge;
a control system, in data communication with said dipensing system, to selectively authorize dispensing of said liquid upon verifying said liquid contains characteristics matching characteristics of liquids previously dispensed from said source, wherein said dispensing system includes a dispensing nozzle system in fluid communication with said primary cartridge and a pump to create a flow of said liquid from primary cartridge to exit said nozzle system, wherein said control system further includes a processor in data communication with said pump and a memory in data communication with said processor, with said memory including a program to be operated on by said processor to produce a request for an authorization code to enable said pump to create said flow, with said request including information concerning said system, defining system data.

11. The system as recited in claim 10 further including an authorization station including means for generating said authorization code in response to said request, and means for communicating said request for said authorization code to said authorization station, with said means for generating said authorization code including a database having historical information including identification codes of cartridges previously associated with said system, defining historical identification codes that include historical data concerning characteristics of liquids contained in said cartridges previously associated with said system and means for comparing said verifiable identification code and said system data to said historical information and means for producing said requested authorization code in response to determining that said historical data matches said verifiable characteristic data.

12. The system as recited in claim 11 further includes means for transmitting said requested authorization code to said system to facilitate activation of said dispensing system in furtherance of dispensing said liquid.

13. The system as recited in claim 11 wherein said program further includes an embedded authorization code and a sub-routine to be operated on by said processor to compare said embedded authorization code with said requested authorization code and activate said pump in response to ascertaining that said embedded authorization code and said requested authorization code match.

14. The system as recited in claim 11 wherein said verifiable characteristic data includes a chemical description of said liquid and said cartridge is formed from a material that is opaque to ultra violet radiation.

15. The system as recited in claim 11 wherein said system data and said historical information further includes a system identification number, with said comparing means further including means for comparing said system identification number in said system data with said system identification number contained in said historical information, and said generating means further includes means for generating said requested authorization code in response to ascertaining that said system identification number in said system data matches said system identification number contained in said historical information and said historical data matches said verifiable characteristic data.

16. The system as recited in claim 11 wherein said system data and said historical information further includes information that uniquely identifies said dispensing system, defining a system identifier, with said comparing means further including means for comparing the system identifier included in said system data with the system identifier included in said historical information, and said generating means further includes means for generating said requested authorization code in response to ascertaining that said system identifier included in said system data matches said system identifier included in said historical information and said historical data matches said verifiable characteristic data.

17. The system as recited in claim 11 wherein said system data includes an additional identification code associated with an additional cartridge, containing an additional liquid, coupled to be selectively placed in fluid communication with said pump, with said additional identification code including data concerning additional characteristics associated with said additional liquid, with said comparing means further including means for comparing said additional identification code with verifiable identification code and generating means further including means for generating said requested authorization code in response to ascertaining that said historical data matches said verifiable characteristic data and said additional characteristics.

18. A system for dispensing a liquid onto a substrate, said system comprising:
a supply containing said liquid, and having an identification code that includes data concerning characteristics of said liquid, defining verifiable characteristic data;
a reader connected to sense said identification code and create a reader signal including information concerning said identification code;
a dispensing nozzle system in fluid communication with said supply;
a pump to create a flow of said liquid from said supply to exit said dispensing nozzle system;
a detector to sense a level of said liquid in said supply and generate a detector signal in response to said level reaching a minimum quantity; and
a processor to receive said detector signal and maintain a continuous flow of said liquid, which is substantially free of gas, to said dispensing nozzle system.

19. The system as recited in claim 18 wherein said supply includes a primary supply of said liquid and a secondary supply of said liquid, with said identification code including a primary identifier, associated with said primary supply, a secondary identifier associated with said secondary supply, said pump creating flow of said liquid from said supply to exit said nozzle system and said processor maintaining said continuous flow by commencing propagation of the liquid from said secondary supply once said detector signal is received.

20. The system as recited in claim 19 further including a valve connected between said first and secondary liquid supplies and said dispensing nozzle system, with said primary supply further including a first receptacle and a first cartridge removably mounted with respect to said first receptacle and said secondary supply includes a second receptacle and a second cartridge removably mounted with respect to said second receptacle.

21. The system as recited in claim 19 wherein said primary supply further includes a reservoir in fluid communication with said dispensing nozzle system and said secondary supply includes a receptacle and a cartridge removably mounted with respect to said receptacle and is in fluid communication with said reservoir.

22. The system as recited in claim 19 further including a memory in data communication with said processor, with said memory including a program to be operated on by said processor to produce a request for an authorization code to enable said pump to create said flow, with said request including information concerning said system and information contained in said reader signed, defining system data; an authorization station including means for generating an authorization code in response to said request; means for communicating said request for said authorization code to said authorization station, with said means for generating an authorization code including a database having historical information including identification codes of cartridges previously associated with said system, defining historical identification codes that include historical data concerning characteristics of liquids contained in said cartridges previously associated with said system and means for comparing said verifiable identification code and said system data to said historical information and means for producing said requested authorization code in response to determining that said historical data matches said verifiable characteristic data; and means for transmitting said requested authorization code to said system to facilitate activation of said dispensing system in furtherance of dispensing said liquid.

23. The system as recited in claim 19 wherein said substrate lies in a plane, and said dispensing nozzle system defines a dispensing axis along which said liquid propagates, with said dispensing nozzle system including means for selectively changing an orientation of said dispensing axis to move between a dispensing orientation and a cleaning orientation, with said dispensing axis extending transversely to said plane in said dispensing orientation and said dispensing axis extending parallel to said plane in said cleaning orientation.

24. The system as recited in claim 23 further including a cleaning station having a chamber with a supply of cleaning liquid; and an evacuation system both of which are in fluid communication therewith, with said dispensing nozzle system being disposed in said chamber when said dispensing axis is in said cleaning orientation.

* * * * *